(12) United States Patent
Koiwai (10) Patent No.: US 9,251,977 B2
(45) Date of Patent: Feb. 2, 2016

(54) ELECTRONIC APPARATUS

(71) Applicant: CANON KABUSHIKI KAISHA, Tokyo (JP)

(72) Inventor: Hiroshi Koiwai, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 158 days.

(21) Appl. No.: 13/719,551

(22) Filed: Dec. 19, 2012

(65) Prior Publication Data

US 2013/0161175 A1  Jun. 27, 2013

(30) Foreign Application Priority Data

Dec. 22, 2011 (JP) ................................. 2011-280809

(51) Int. Cl.
| | | |
|---|---|---|
| H01H 19/02 | (2006.01) | |
| H03K 17/975 | (2006.01) | |
| H01H 19/14 | (2006.01) | |
| H03K 17/96 | (2006.01) | |
| H03K 17/98 | (2006.01) | |

(52) U.S. Cl.
CPC ............. *H01H 19/02* (2013.01); *H01H 19/14* (2013.01); *H03K 17/9622* (2013.01); *H03K 17/975* (2013.01); *H03K 17/98* (2013.01); *G03B 2217/002* (2013.01); *H03K 2217/94068* (2013.01)

(58) Field of Classification Search
CPC ......... H01H 3/08; H01H 19/00; H01H 19/02; H01H 19/14; H01H 19/54; H03K 17/962; H03K 17/9622; H03K 17/965; H03K 17/975
USPC ............................................................ 200/14
See application file for complete search history.

(56) References Cited

U.S. PATENT DOCUMENTS

| | | | | |
|---|---|---|---|---|
| 8,294,049 | B2 * | 10/2012 | Tsuduki ........................ 200/5 R |
| 8,336,424 | B2 * | 12/2012 | Miret et al. ..................... 74/553 |
| 2008/0111428 | A1 * | 5/2008 | Baier et al. .................... 307/112 |
| 2011/0240455 | A1 * | 10/2011 | Kulczycki et al. ............ 200/600 |

FOREIGN PATENT DOCUMENTS

| | | |
|---|---|---|
| JP | 2006-157154 A | 6/2006 |
| JP | 2006-119519 A | 11/2006 |

* cited by examiner

*Primary Examiner* — Renee Luebke
*Assistant Examiner* — Lheiren Mae A Caroc
(74) *Attorney, Agent, or Firm* — Rossi, Kimms & McDowell LLP (57) ABSTRACT

An electronic apparatus of the present invention includes an operating portion formed by a non-conductive material, a rotating plate configured to rotate in accordance with a rotational operation of the operating portion, a substrate including a first sensing electrode whose capacitance changes by a touch operation to the operating portion and a plurality of second sensing electrodes whose potential changes by a rotation of the rotating plate on a surface different from a surface on which the first sensing electrode is disposed, and a detector configured to detect the capacitance of the first sensing electrode and the rotational operation of the operating portion based on an output from the plurality of second sensing electrodes. A protruding portion that protrudes toward the first sensing electrode is formed on the operating portion, and the protruding portion is formed on a lightening portion on a back side of the operating portion.

15 Claims, 9 Drawing Sheets

ELECTRONIC APPARATUS

BACKGROUND OF THE INVENTION

1. Field of the Invention

The present invention relates to an electronic apparatus such as a digital camera and, in particular, relates to the electronic apparatus having an operating portion such as an electric dial.

2. Description of the Related Art

Some electronic apparatuses such as digital cameras have an electric dial as an operating portion that changes set values of shutter speed, an aperture, and ISO sensitivity as described in Japanese Patent Laid-Open No. 2006-119519. The electric dial has a dial portion capable of rotating operation, and a dial substrate that rotates with the dial portion. The dial substrate contacts with an armature, and a rotational operation of the dial portion is detected when an electrode formed on the dial substrate contacts the armature by the rotating operation of the dial portion. Moreover, a click mechanism is provided on the electric dial, and users feel a click feeling when the dial portion is rotationally operated.

Further, Japanese Patent Laid-Open No. 2006-157154 discloses an electronic apparatus that has a fingerprint detection input device and is operated by sliding on the fingerprint detection input device at user's fingertips.

In Japanese Patent Laid-Open No. 2006-119519, since the electric dial has the click mechanism, click sound is recorded by rotationally operating the click portion while taking a movie picture when sound is recorded simultaneously so as to change the set values such as an aperture, shutter speed (storage time), and ISO sensitivity.

In Japanese Patent Laid-Open No. 2006-157154, sliding noise is recorded by changing the set values such as an aperture, shutter speed (storage time), and ISO sensitivity while taking a movie picture when sound is recorded simultaneously since user slides on the fingerprint detection input device at user's fingertips.

SUMMARY OF THE INVENTION

The present invention provides an electronic apparatus capable of performing an operation that changes set values such as an aperture, shutter speed (storage time), and ISO sensitivity without generating click sound and sliding noise.

An electronic apparatus as one aspect of the present invention includes an operating portion formed by a non-conductive material, a rotating plate configured to rotate in accordance with a rotational operation of the operating portion, a substrate including a first sensing electrode whose capacitance changes by a touch operation to the operating portion and a plurality of second sensing electrodes whose potential changes by a rotation of the rotating plate on a surface different from a surface on which the first sensing electrode is disposed, and a detector configured to detect the capacitance of the first sensing electrode and the rotational operation of the operating portion based on an output from the plurality of second sensing electrodes. A protruding portion that protrudes toward the first sensing electrode is formed on the operating portion, and the protruding portion is formed on a lightening portion on a back side of the operating portion.

Further features and aspects of the present invention will become apparent from the following description of exemplary embodiments with reference to the attached drawings.

DESCRIPTION OF THE PREFERRED EMBODIMENTS

Exemplary embodiments of the present invention will hereinafter be described with reference to the accompanying drawings.

Figure 1A:
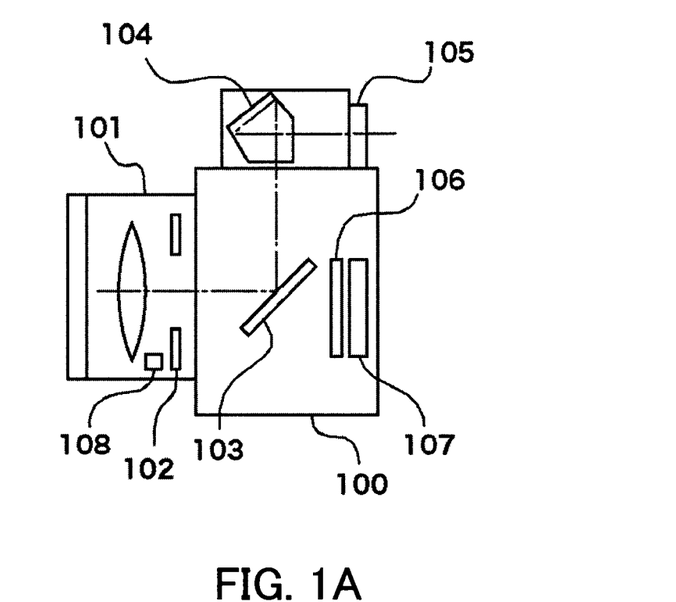
FIG. 1A is a schematic cross-sectional view along an optical axis direction of a digital camera that is one example of the embodiment of an electronic apparatus and FIG. 1B is a rear view of the digital camera which is shown in FIG. 1A.

FIG. 1A is a schematic cross-sectional view along an optical axis direction of a digital camera that is one example of the embodiment of an electronic apparatus.

Reference numeral 100 denotes a main body of the digital camera, reference numeral 101 denotes an image-pickup lens of replaceable type, and reference numeral 102 denotes an aperture apparatus. Reference numeral 103 denotes a mirror capable of superiorly reflecting an object light that passes the image-pickup lens 101 and the aperture apparatus 102. Reference numeral 104 denotes a pentaprism and reference numeral 105 denotes an optical viewfinder where the object light is introduced through the pentaprism 104. Reference numeral 106 denotes a shutter apparatus and reference numeral 107 denotes an image-pickup element where the object light passed the image-pickup lens 101 and the shutter apparatus 102 when the mirror 103 leaves from the optical axis forms an image through the shutter apparatus 106. Reference numeral 108 denotes a gyro sensor that detects an amount of blurring when taking a picture.

Figure 1B:
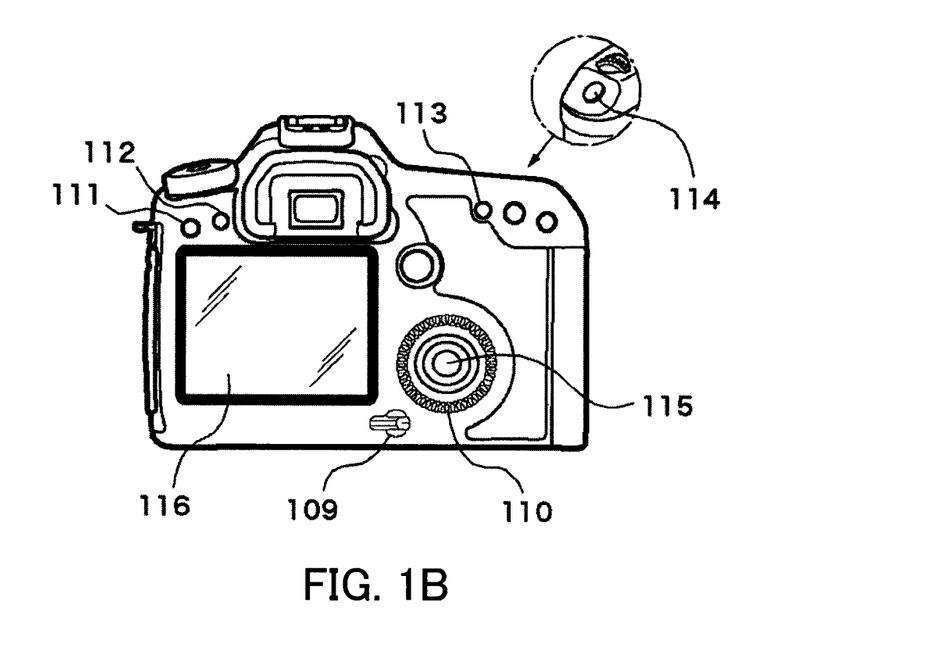

FIG. 1B is a rear view of the main bogy of the digital camera 100 which is shown in FIG. 1A.

Reference numeral 109 denotes a power switch that directs ON/OFF of a power supply of the main body of the digital camera 100. Reference numeral 110 denotes an electric dial to set shutter speed, an aperture and ISO sensitivity, and to select an item with a menu panel displayed in a display. Reference numeral 111 denotes a live view button that directs start of a live view shooting. Reference numeral 112 denotes an animation start button that directs start of animation shooting in a live view shooting mode. Reference numeral 113 denotes an operation start instruction button that directs start of AF (automatic focus) operation, AE (automatic exposure) and AWB (automatic white balance) operation. Reference numeral 114 denotes a release button that directs start of the AF operation, the AE operation and the AWB operation by a half-pressing operation, and directs start of shooting by a full-pressing operation. Reference numeral 115 denotes a decision button (button member) so as to decide a selection when variously selecting by the electric dial 110. Reference numeral 116 denotes a display.

Figure 2:
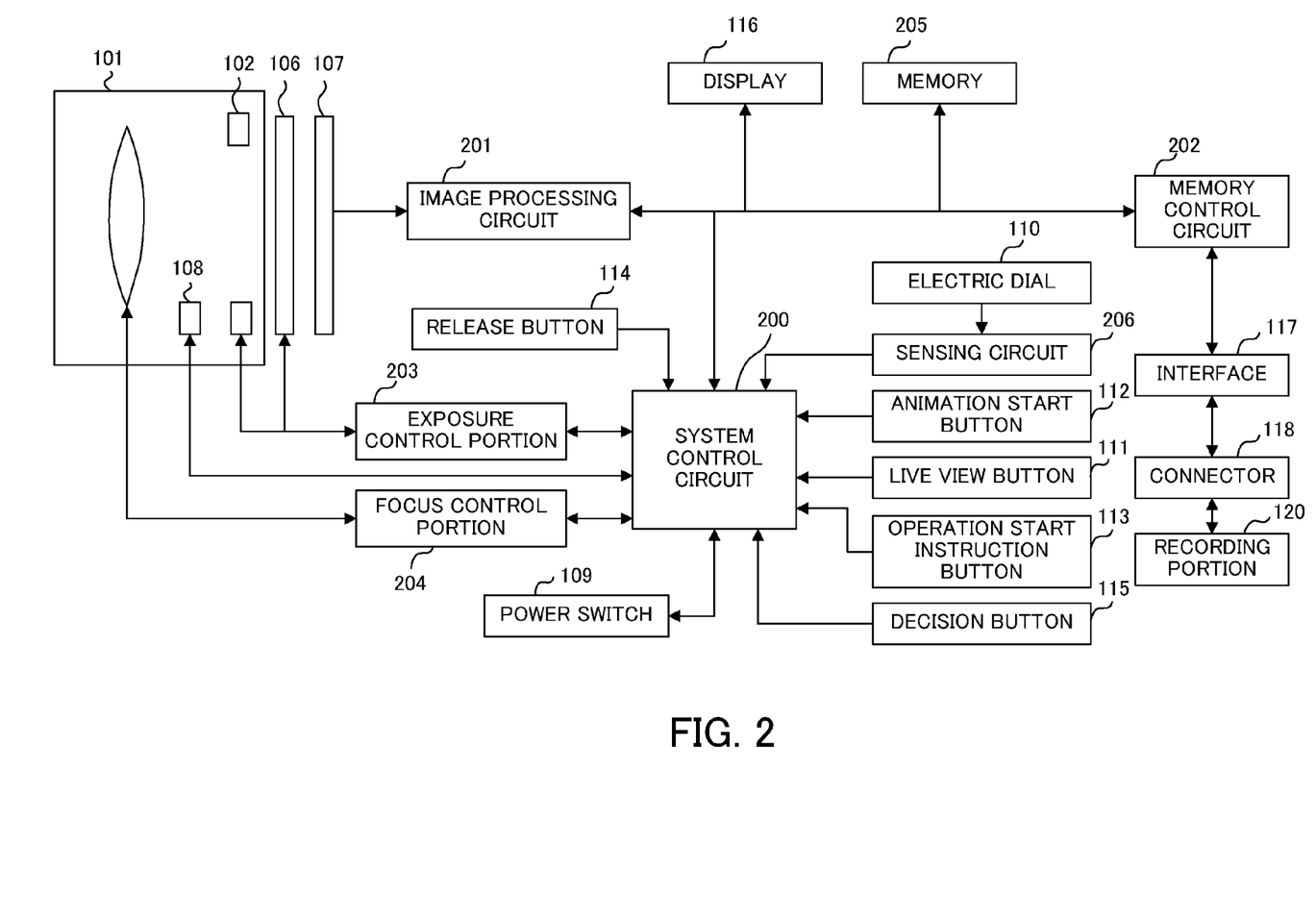
FIG. 2 is a block diagram of describing a control system of a digital camera.

FIG. 2 is a block diagram to describe a control system of the digital camera 100.

Reference numeral 200 denotes a system control circuit that includes a CPU, a ROM and a RAM, which controls the whole main body of the digital camera 100. Reference numeral 201 is an image processing circuit and reference numeral 202 denotes a memory control circuit. Reference numeral 203 denotes an exposure control portion that controls the aperture apparatus 102 and the shutter apparatus 106. Reference numeral 204 denotes a focus control portion to control focus of the image-pickup lens 101. Reference numeral 205 denotes a memory that stores data of a still image and a moving image which is taken. Reference numeral 206 denotes a sensing circuit that detects an operation of the electric dial 110.

The image processing circuit 201 processes a prescribed pixel complement processing and a color conversion processing to the image data output from the image-pickup element 107 and the image data output from the memory control circuit 202. The image processing circuit 201 processes prescribed arithmetic processing and the system control circuit 200 processes prescribed the AF operation, the AE operation and the AWB operation based on the acquired arithmetic result.

The memory control circuit 202 controls the image processing circuit 201 and the memory 205. The image data output from the image-pickup element 107 uses image processing circuit 201 and memory control circuit 202 or is written the memory 205 through the memory control circuit 202 and the memory 205 or through directly the memory control circuit 202.

Reference numeral 117 denotes an interface, reference numeral 118 denotes a connector and reference numeral 120 denotes a recording portion.

The interface 117 connects the recording portion 120 such as a memory card and a hard disk, and the main body of the digital camera 100 through the connector 118.

Figure 3:
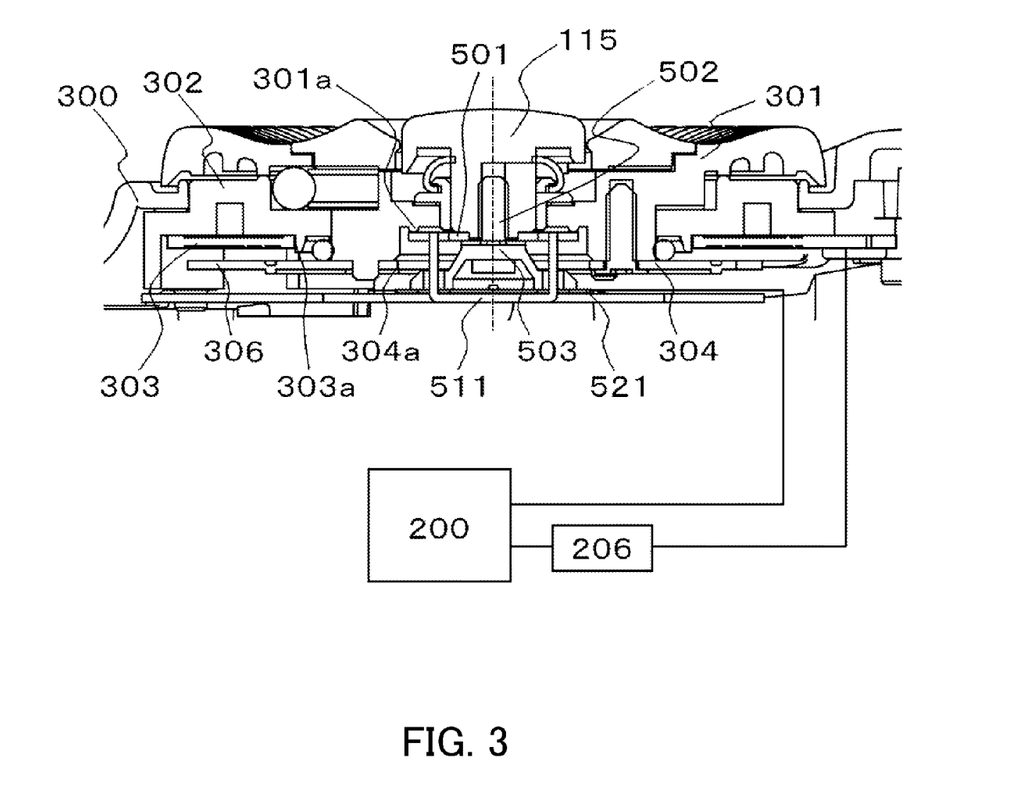
FIG. 3 is a cross-sectional view of an electric dial.
Figure 4:
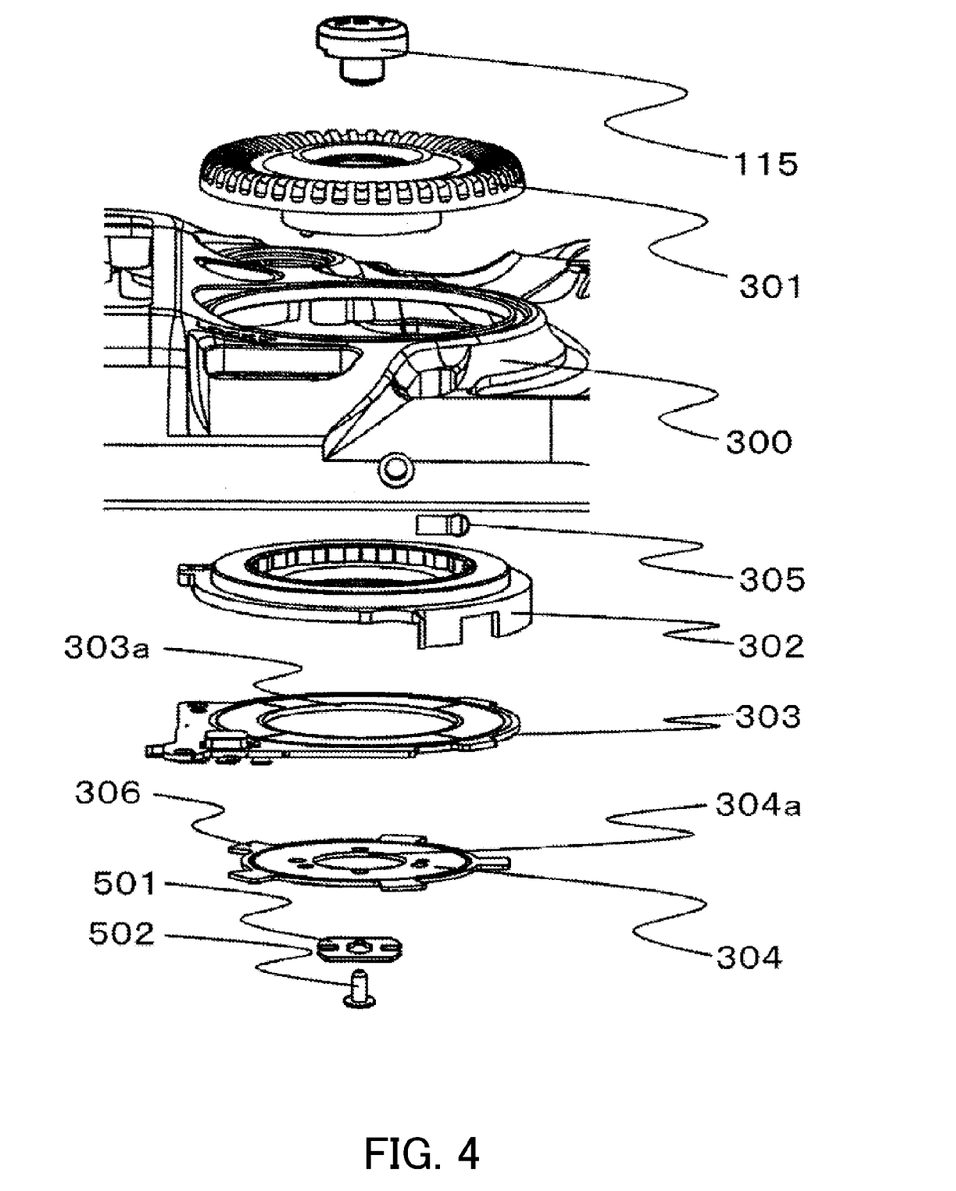
FIG. 4 is an exploded perspective view of an electric dial.

Next, the electric dial 110 that corresponds to one example of the operating portion of the present invention is described referring to FIGS. 3-5.

FIG. 3 is a cross-sectional view of the electric dial 110. FIG. 4 is an exploded perspective view of the electric dial 110.

Reference numeral 300 denotes an exterior cover, reference numeral 301 denotes an operating portion capable of operating rotationally, reference numeral 302 denotes a supporting portion, reference numeral 303 denotes a printed substrate and reference numeral 304 denotes a rotating plate. Reference numeral 301a denotes a convex part formed on the operating portion 301, reference numeral 303a denotes a hole part formed on the printed substrate 303 and reference numeral 304a denotes a hole part formed on the rotating plate 304. Reference numeral 305 denotes a click generating portion having a ball and a spring. Reference numeral 306 denotes detected objects formed on a periphery of the rotating plate 304. Reference numeral 501 denotes a decision button holding portion, reference numeral 502 denotes a screw, reference numeral 503 denotes an elastic switch, reference numeral 511 denotes a holding portion (a fixed portion) and reference numeral 521 denotes a flexible substrate fixed on the holding portion.

The operating portion 301 is rotatably supported by the supporting portion 302 and the supporting portion 302 is fixed on the exterior cover 300. Further, the printed substrate 303 is fixed on a back side of the supporting portion 302 (the bottom side of FIGS. 3 and 4).

The ball and the spring that constitute the click generating portion 305 are stored in the operating portion 301. The spring constituting the click generating portion 305 biases the ball constituting the click generating portion 305 to a click board wavelike formed on an inner periphery of the supporting portion 302 along its circumferential direction. As a result, when a user rotationally operates the operating portion 301, click feeling is given to the user. Further, the decision button 115 is arranged at the rotation center of the operating portion 301 so as to be capable of performing a pressing operation.

Figure 5A:
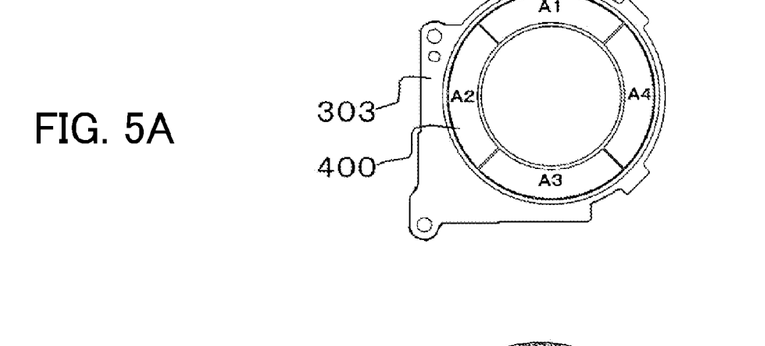
FIG. 5A is a diagram of a printed substrate seen from a first sensing electrode side.
Figure 5B:
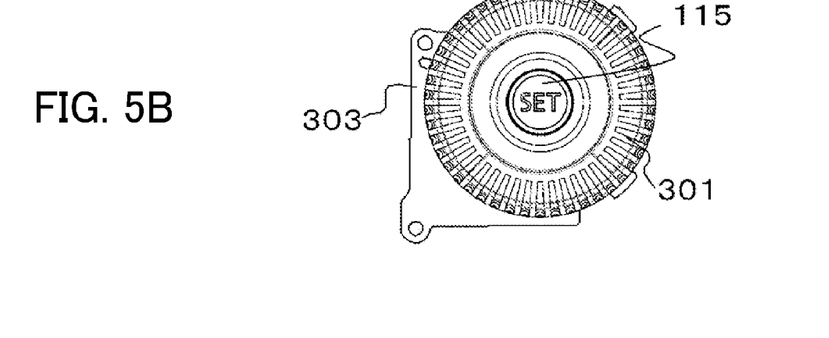
FIG. 5B is a relationship diagram between the printed substrate and an operating portion.
Figure 5C:
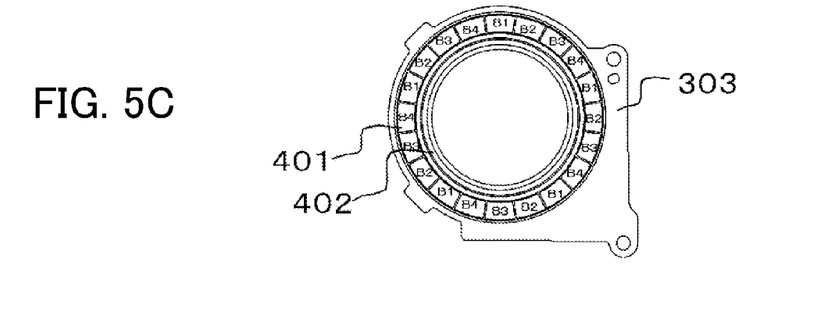
FIG. 5C is a diagram of the printed substrate seen from a second sensing electrode side.
Figure 5D:
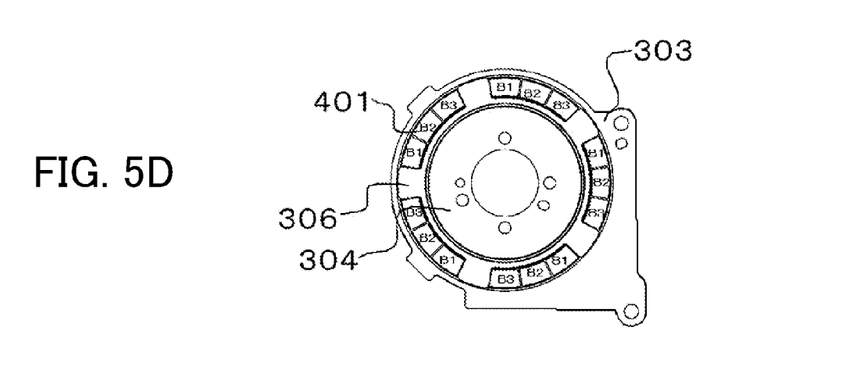
FIG. 5D is a relationship diagram between the printed substrate and a rotating plate.

FIG. 5A is a diagram of the printed substrate 303 seen from a first sensing electrode group side, FIG. 5B is a relationship diagram between the printed substrate 303 and the operating portion 301, FIG. 5C is a diagram of the printed substrate 303 seen from a second sensing electrode group side, and FIG. 5D is a relationship diagram between the printed substrate 303 and the rotating plate 304.

Reference numeral 400 denotes a first sensing electrode group formed on a surface side of the printed substrate 303 (an upper side of FIGS. 3 and 4) and reference numeral 401 denotes a second sensing electrode group formed on a back side of the printed substrate 303. Reference numeral 402 denotes a ground electrode that is formed on the inner periphery of the printed substrate 303 in plane with the second sensing electrode group 401.

Both the first sensing electrode group 400 and the second sensing electrode group 401 are a capacitance type, and a change of capacitance of the first sensing electrode group 400 and the second sensing electrode group 401 is detected by the sensing circuit 206.

The first sensing electrode group is constituted of four sensing electrodes A1-A4 arranged in a circumferential direction as illustrated in FIG. 5A, and the four sensing electrodes A1-A4 are formed so as to be at regular interval in the circumferential direction. Here, though the four sensing electrodes A1-A4 are arranged in the circumferential direction in the embodiment, the four sensing electrodes A1-A4 may not be arranged in the circumferential direction.

On the other hand, as shown in FIG. 5C, five pairs of four sensing electrodes B1-B4 arranged in a circumferential direction, i.e., 20 electrodes are formed on the second sensing electrode group 401 at regular interval in the circumferential direction. The number of sensing electrodes of the second sensing electrode group 401 is set so as to become the same as click counts (20) when the operating portion 301 is rotated one revolution. The rotation of the rotating plate is detected in conjunction with the generation of click feeling when the operating portion 301 is rotationally operated. Here, though the four sensing electrodes B1-B4 are arranged in the circumferential direction in the embodiment, the four sensing electrodes B1-B4 may not be arranged in the circumferential direction.

The rotating plate 304 is fixed on the operating portion 301 so as to oppose to the ground electrode 402 on the back side of the printed substrate 303. The detected objects 306 are formed along the circumferential direction of the rotating plate 304 at regular interval so as to oppose to one sensing electrode that constitutes the second sensing electrode group 401. Further, a shape of the detected objects 306 are assumed to be the same as one sensing electrode that constitutes the second sensing electrode group 401. The detected objects 306 are only arranged the same number (five in the embodiment) as the number of set of the four sensing electrodes B1-B4 that compose the second sensing electrode. As shown in FIG. 5(*d*), for example, when one of the detected objects 306 axially opposes to the sensing electrode B4, other detected objects 306 axially oppose to the sensing electrode B4. When the rotating plate 304 is rotated right from the state shown in FIG. 5(*d*), all detected objects 306 axially oppose to the sensing electrode B1. Here, in the embodiment, the first sensing electrode group 400 is used so as to detect a touch operation on the surface of the operating portion 301 by the human body (user). Therefore, either of electrostatic capacitances of the sensing electrodes A1-A4 changes and the sensing circuit 206 detects this change when the human body approaches the surface of the operating portion 301. And the system control circuit judges the touch operation of either of the left, right, top and bottom surface of the operating portion 301 based on the detection result of the sensing circuit 206.

On the other hand, the second sensing electrode group 401 is used so as to detect the rotational operation of the detected objects 306 formed on the rotating plate 304. The rotating plate 304 opposes to the ground electrode 402 so as to electrostatically couple. Therefore, the sensing electrode of the electrodes B1-B4 of the second sensing electrode group 401 axially opposed to the detected objects 306 formed on the rotating plate 304 electrostatically couples the ground electrode 402 through the rotating plate 304.

For example, in reference to FIG. 5D, when the rotating plate rotates from the state that the detected object 306 opposes to the sensing electrode B4 of the second sensing electrode group 401 to the state that the detected object 306 opposes to the sensing electrode, the sensing circuit 206 detects the change of the capacitances of the sensing electrodes B4 and B1. And, in FIG. 5D, the system control circuit 200 detects clockwise rotation of the rotating plate 304 based on the detection result of the sensing circuit 206. Therefore, in FIG. 5B, the system control circuit 200 judges that the operating portion 301 is operated counterclockwise rotation.

Here, if the material of the operating portion 301 and the supporting portion 302 is electrically-conducting material, the entire surfaces of the operating portion 301 and the supporting portion 302 become equipotent, and the sensing circuit 206 detects that all sensing electrodes A1-A4 of the first sensing electrode group 400 are equipotent when the human body approaches. Therefore, the system control circuit 200 just judges whether the operating portion 301 is touched for the operation or not, and does not judge for the touch operation at which position of the operating portion 301 is operated.

Then, the embodiment makes the operating portion 301 and the supporting portion 302 such as the ceramics and the resin material so as to detect the touch operation on either of the left, right, top and bottom position of the operating portion 301 and secure the same function as the rotational operation of the conventional electrical dial.

Further, in the embodiment, the rotating plate 304 are axially opposed to the ground electrode 402 regardless of the rotating plate 304 by forming the ground electrode 402 on all circumferential direction of the printed substrate 303, and a detection sensitivity is improved.

Figure 6A:
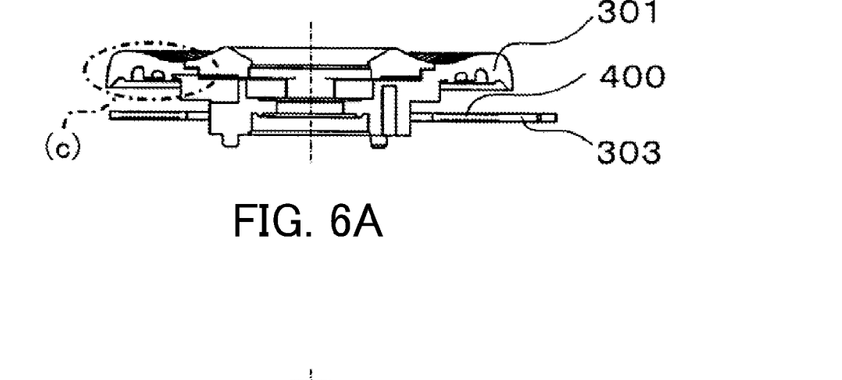
FIG. 6A is a central cross-sectional view between a printed substrate and an operating portion.
Figure 6B:
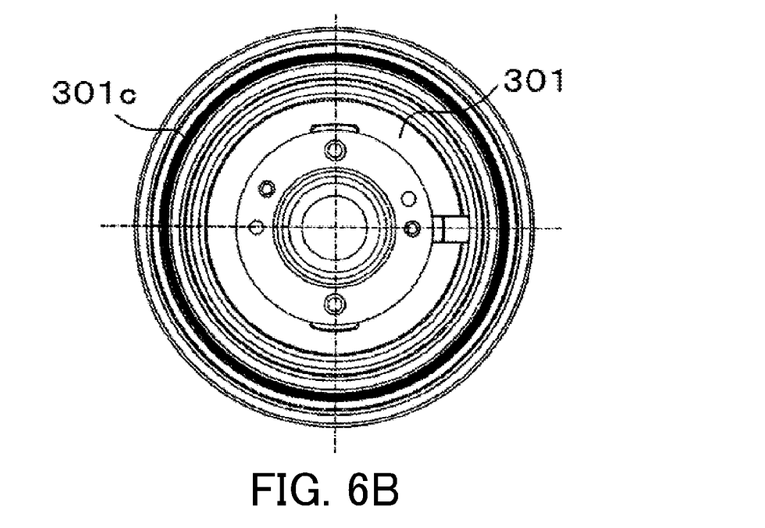
FIG. 6B is a diagram on a printed substrate side of the operating portion.
Figure 6C:
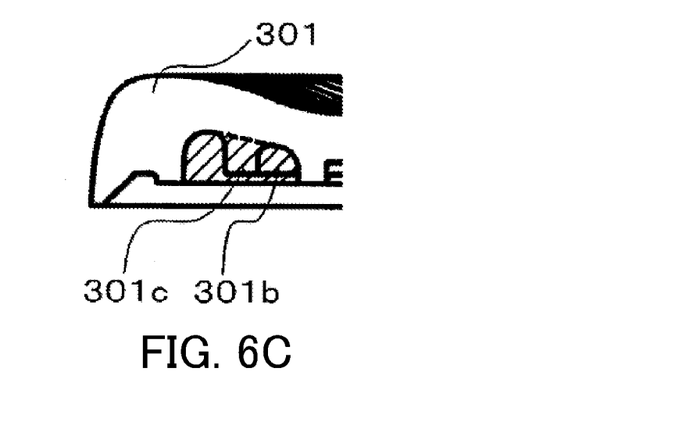
FIG. 6C is an enlarged view of a lightening portion of the operating portion.

Next, how to improve a detection sensitivity of a touch operation on a surface is described in the embodiment referring to FIG. 6. Since the operating portion 301 uses non-conductive materials such as the ceramics and the resin material as previously explained, a lightening portion should be generally composed for equal thickness. Reference numeral 301*b* denotes a lightening portion formed on the back side of the operation portion 301 and reference numeral 301*c* denotes a rib shape (a protruding portion) formed on the lightening portion 301*b*.

Either of capacitances of the sensing electrodes A1-A4 changes and the sensing circuit 206 detects the change when the human body approaches the surface of the operating portion 301 (the top side of FIG. 6A) as previously explained. And the system control circuit 200 judges the touch operation on either of the left, right, top and bottom surface of the operating portion 301 based on the detection result of the sensing circuit 206. FIG. 6A shows only the printed substrate 303 and the operating portion 301 so as to facilitate explaining.

A space indicated by a shaded area of FIG. 6C is the lightening portion 301*b* and the change of capacitance detected by the first sensing electrode group 400 decreases if an air interval exists between the first sensing electrode group 400 and the surface of the operating portion 301. In the embodiment, the rib shape 301*c* is projecting formed to the lightening portion 301*b* composed on the back side of the operating portion 301 that opposes to the first sensing electrode group 400 formed on the surface side of the printed substrate 303 so as to decrease the air interval. Therefore, when the human body approaches the surface of the operating portion 301 (the top side of FIG. 6A), the electrostatic capacitance on either surface of the sensing electrodes A1-A4 more stably change and the sensing circuit 206 can detect this change.

Figure 7A:
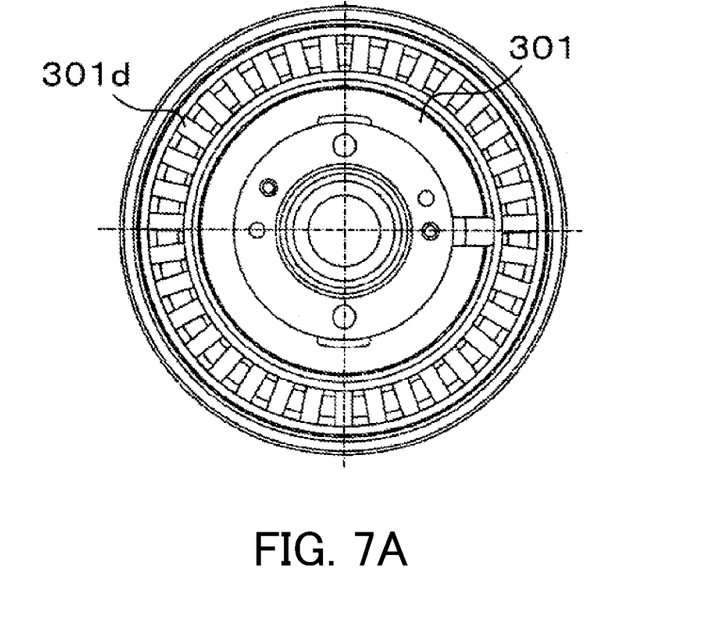
FIG. 7A is a diagram of another type lightening portion on a printed substrate side of an operating portion and FIG. 7B is a diagram to describe a method so as to fix another part to the operating portion.
Figure 7B:
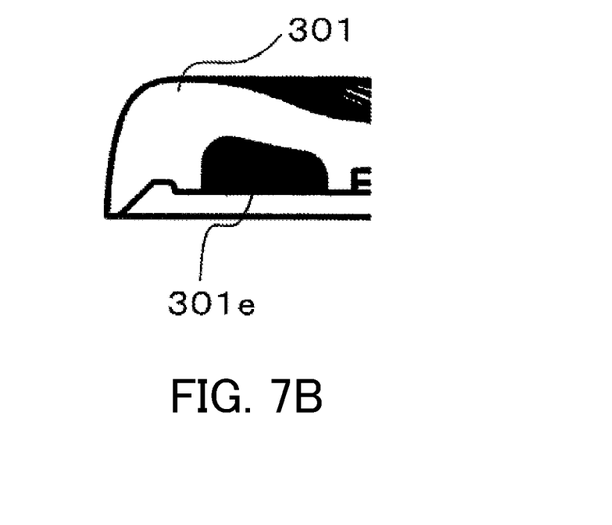

Next, the example of preventing the change of the capacitance that the sensing circuit 206 detects from decreasing by using another rib shape and another non-conductive material is described referring to FIG. 7.

FIG. 7A is a diagram of another type lightening portion on the printed substrate 303 side of the operating portion 301 similar to FIG. 6B. In FIG. 6B, though the rib shape 301*c* is continuously formed in the circumferential direction where the sensing electrodes A1-A4 of the first sensing electrode group 400 is arranged, plural rib shapes 301*d* may be radially formed on the lightening portion 301*b* as shown in FIG. 7A. At this time, the plural of rib shapes 301*d* are formed along circumferential direction of the operating portion 301 at equal intervals. Further, the number of the plural rib shapes 301*d* is desirable to be the integral multiple of click counts (20) around the operating portion 301 since the operating portion 301 rotates by the rotational operation.

FIG. 7B is an enlarged drawing of the lightening portion 301*b* of the operating portion 301 similar to FIG. 6C. Reference numeral 301*e* denotes a non-conductive material which is the same shape of the lightening portion 301*b* and is fixed on the convex portion 301*a*. Therefore, when the human body approaches the surface of operating portion 301 (the top side of FIG. 6A), the capacitance on either of the surface of the sensing electrodes A1-A4 more stably changes and the sensing circuit 206 can detect this change. The non-conductive material 301*e* are painted out in the drawing for ease of explanation.

Figure 8A:
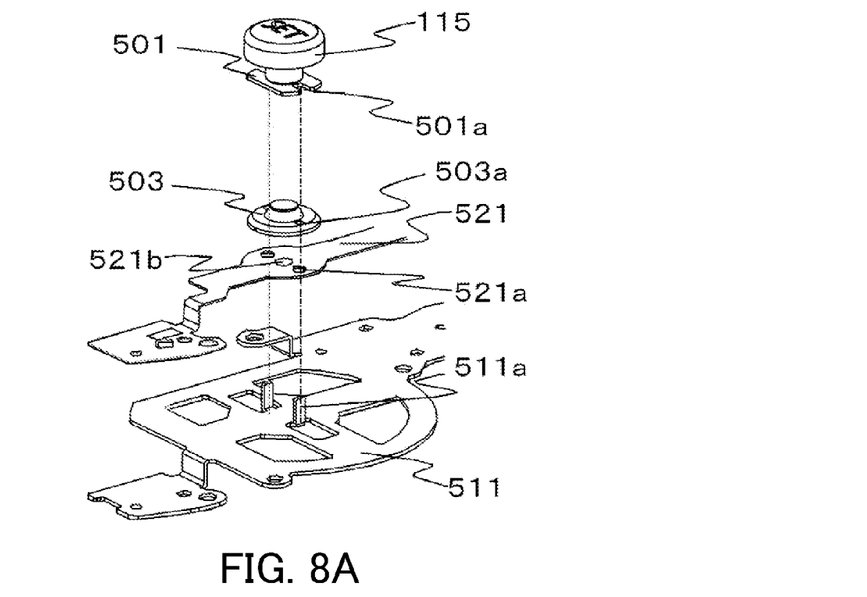
FIG. 8A is an exploded perspective view which shows a relationship between a decision button and a holding member.
Figure 8B:
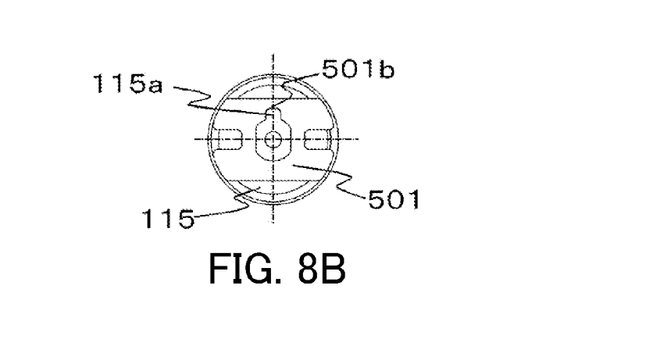
FIG. 8B is a diagram of the decision button and FIG. 8C is a relationship diagram between the holding member and the decision button.
Figure 8C:
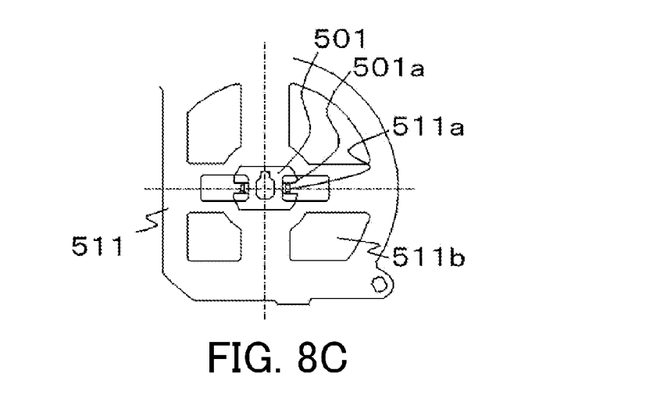
Figure 9A:
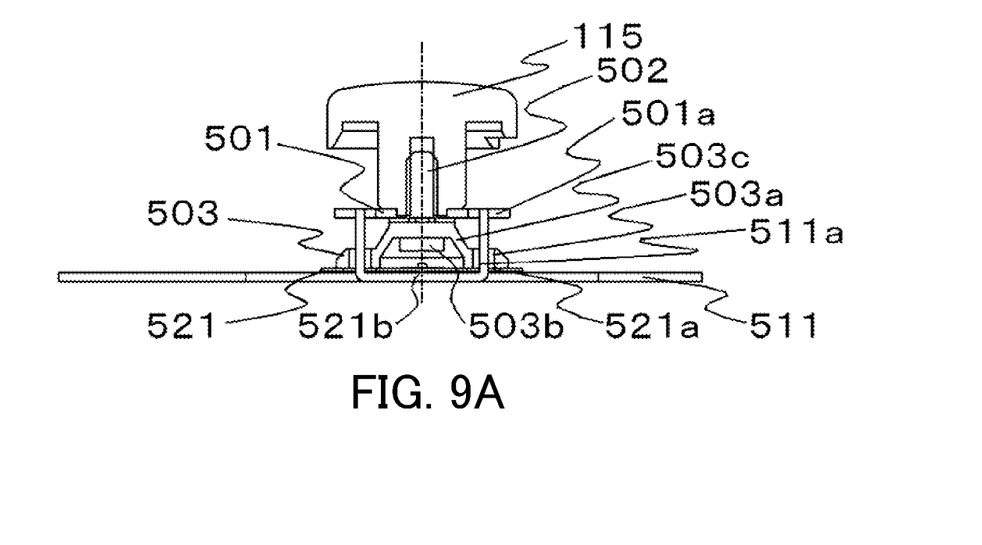
FIG. 9A is a cross-sectional view along an axis direction of the decision button shown a state before the decision button is pushed and FIG. 9B is a cross-sectional view along an axis direction of the decision button shown a state when the decision button is pushed.
Figure 9B:
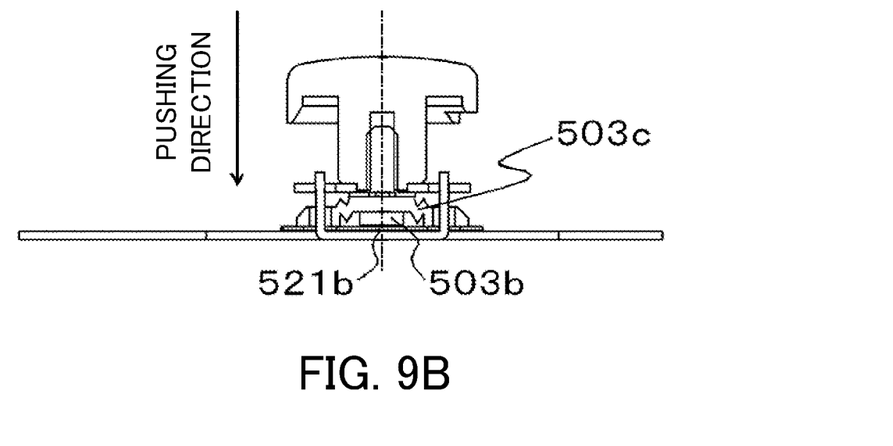

Next, the rotation restriction by the holding member 511 of the decision button 115 is described referring to FIGS. 3, 8, and 9.

The decision button 115 is arranged in the central portion of the operating portion 301 as shown in FIG. 3. In addition, the decision button is fixed in penetrating through the operating portion 301 since the decision button holding portion is fixed by the screw 502 from a descent direction on a plane of paper. The convex portion 301a restricts the decision button holding portion 501 to move an upper direction on a plane of paper. Therefore, the decision button 115 cannot move an upper direction on a plane of paper since the decision button holding portion is fixed. On the other hand, the screw 502 is biased to an upper direction on a plane of paper by the elastic switch 503 on the flexible substrate. The holding member 511 is fixed on the exterior cover though it is not shown in the drawing. In addition, the decision button 115, the decision button holding portion 501, the screw 502 and the elastic switch 503 are composed of an outside diameter that is smaller than the hole part 303a of the printed substrate 303 and the hole part 304a of the rotating plate 304, and are non-related to the detection of the touch operation.

FIG. 8A is an exploded perspective view which shows a relationship between the decision button 115 and the holding member 511.

Reference numeral 501a denotes a rotation restriction part formed on the decision button holding portion 501, reference numeral 503a denotes a hole part formed on the elastic switch, reference numeral 511a denotes a click part formed on the holding member 511, and reference numeral 521a denotes a hole part formed on the flexible substrate. Though the click part 511a may be plurally formed, the example of two click parts formed is described in the embodiment. Other parts are not shown in FIG. 8A to facilitate explaining. The click part 511a penetrates the hole part 521a and the hole part 503a. As a result, the holding member 511, the flexible substrate 521 and the elastic switch 503 can be position accuracy.

FIG. 8B is a block diagram of the decision button 115 seen from the inside of the main body of the digital camera 100 toward its outside.

Reference numeral 115a denotes a concave portion formed on the decision button 115 and reference numeral 501b denotes a concave portion formed on the decision button holding portion 501. The decision button 115 and the decision button holding portion 501 are positioned in the rotational direction and fixed by fitting the convex portion 115a and the concave part 501b and fixing them.

FIG. 8C is a relationship diagram between the holding member 511 and the decision button 115 seen from the appearance side of the main body of the digital camera 100 toward its inside.

Reference numeral 511b denotes a hole part formed in the part opposed to the sensing electrodes B1-B4 of the second sensing electrode group 401 of the holding member 511. The rotation detection accuracy of the operating portion 301 can be improved by forming the hole part 511b.

The holding member 511 can be restricted rotationally by the decision button holding portion 501 since the click part 511a that projects in a plane of paper direction fits the rotation restriction part 501a.

Therefore, the decision button 115 doesn't rotate by the holding member 511 through the decision button holding portion 501 in accordance with the rotational operation of the operating portion 301. If a character (for example, "SET") is displayed on the surface of the decision button 115, the visibility of the character is good since the decision button 115 doesn't rotate in accordance with the rotation of the operating portion 301 and the character doesn't rotate.

Further, the decision button 115, the decision button holding portion 501, and the holding member 511 are composed of the conductive member. Therefore, static electricity generated near the surface of the decision button 115 doesn't discharge the inside electronic parts of the main body of the digital camera 100, and conducts to the exterior cover 300.

Thus, hanging up of the main body of the digital camera 100 by static electricity and electrostatic discharge failure can be prevented.

Next, the pushing operation of the decision button 115 is described. FIG. 9A is a cross-section view along an axis direction of the decision button 115 shown a state before the decision button 115 is pushed and FIG. 9B is a cross-sectional view along an axis direction of the decision button 115 shown a state when the decision button 115 is pushed. Other parts are not shown in the drawings so as to facilitate explaining.

Reference numeral 503b denotes a conductive part, reference numeral 503c denotes a skirt part, and they are formed on the elastic switch 503.

The decision button 115, the decision button holding portion 501, and the screw 502 are one unit as shown in FIG. 9A. Further, the holding member 511, the flexible substrate 521 and the elastic switch 503 are one unit. The decision button 115 is biased in a plane of paper direction by the elastic switch 503.

The operation when the operator pushes the decision button 115 in the pushing direction from this state is described. At this time, the skirt 503c elastically deformed as shown in FIG. 9B and the conductive part 503b comes into contact with the flexible substrate 521. A detection pattern 521b is composed on the position where the conductive part 503b comes into contact with the flexible substrate 521 on the flexible substrate 521. When the detection pattern 521b contact with the conductive part 503b, the system control circuit 200 judges the pushing operation of the decision button 115.

Next, the skirt 503c which is elastically deformed returns to the state of FIG. 9A and the decision button 115 returns when the operator stops the pushing of the decision button 115 in the pushing direction.

Set values of the aperture, the shutter speed and the ISO sensitivity are changed by the touch operation of the operating portion 301 in the embodiment as described above. Therefore, even if the electric dial 110 has the click mechanism, neither the clicking sound nor the sliding sound is generated while recording a video that records the voice simultaneously. Thus, the clicking sound and the sliding sound can be prevented being recorded while recording a video that records the voice simultaneously.

Further, in the embodiment, both the first sensing electrode group 400 and the second sensing electrode group 401 are an electrostatic capacitance type, and durability can be improved compared with the electric dial using the armature since the change of the capacitance of each sensing electrode is detected with the sensing circuit 206.

The composition of the present invention is limited to an exemplification of the embodiment, and it is possible to change a material, a shape, a size, a mode, a number and an arrangement position arbitrarily within the range which doesn't deviate from the argument of the present invention.

For example, though the embodiment illustrates that the set value of the aperture, the shutter speed and the ISO sensitivity are changed by the touch operation of the operating portion 301 while recording a video, the set value may be changed by touch operation of the operating portion 301 while taking a still picture.

In addition, the visibility of the character on decision button 115 is good since the decision button 115 doesn't rotate even if the electric dial 110 is stopped at any rotational position by the rotational operation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-280809, filed on Dec. 22, 2011, which is hereby incorporated by reference herein in its entirety.

What is claimed is:

1. An electronic apparatus comprising:
an operating member formed by a non-conductive material;
a rotating member configured to rotate in accordance with a rotational operation of the operating member;
a substrate including a first sensing electrode whose capacitance changes by a touch operation to the operating member and a plurality of second sensing electrodes whose potential changes by a rotation of the rotating member; and
a detector configured to detect the capacitance of the first sensing electrode and the rotational operation of the operating member based on an output from the plurality of second sensing electrodes,
wherein the plurality of second sensing electrodes are disposed on a surface different from a surface on which the first sensing electrode is disposed,
wherein a protruding portion formed on the operating member protrudes toward the first sensing electrode, and
wherein the substrate is disposed between the operating member and the rotating member.

2. The electronic apparatus according to claim 1, wherein the first sensing electrode is formed on the substrate in a circumferential direction.

3. The electronic apparatus according to claim 1, wherein the protruding portion has a rib shape.

4. The electronic apparatus according to claim 1, wherein the protruding portion is continuously formed along the first sensing electrode.

5. The electronic apparatus according to claim 1, wherein the protruding portion includes a plurality of protrusions that are formed along the first sensing electrode at equal intervals.

6. The electronic apparatus according to claim 1, wherein a lightening portion is formed on a back side of the operating member, and
wherein the protruding portion is formed on the lightening portion.

7. The electronic apparatus according to claim 1, wherein the first sensing electrode faces the operating member, and the second sensing electrodes face the rotating member.

8. An electronic apparatus comprising:
an operating member formed by a non-conductive material;
a rotating member configured to rotate in accordance with a rotational operation of the operating member;
a substrate including a first sensing electrode whose capacitance changes by a touch operation to the operating member and a plurality of second sensing electrodes whose potential changes by a rotation of the rotating member; and
a detector configured to detect the capacitance of the first sensing electrode and the rotational operation of the operating member based on an output from the plurality of second sensing electrodes,
wherein the plurality of second sensing electrodes are disposed on a surface different from a surface on which the first sensing electrode is disposed,
wherein a protruding portion formed on the operating member protrudes toward the first sensing electrode, and
wherein the rotating member comprises detected objects configured to face the second sensing electrodes, the detected objects protruding from an outer circumference of the rotating member.

9. The electronic apparatus according to claim 8, wherein the detector is configured to detect the rotational operation of the operating member using the detected objects and the second sensing electrodes.

10. The electronic apparatus according to claim 8, wherein the first sensing electrode is formed on the substrate in a circumferential direction.

11. The electronic apparatus according to claim 8, wherein the protruding portion has a rib shape.

12. The electronic apparatus according to claim 8, wherein the protruding portion is continuously formed along the first sensing electrode.

13. The electronic apparatus according to claim 8, wherein the protruding portion includes a plurality of protrusions that are formed along the first sensing electrode at equal intervals.

14. The electronic apparatus according to claim 8, wherein a lightening portion is formed on a back side of the operating member, and
wherein the protruding portion is formed on the lightening portion.

15. The electronic apparatus according to claim 8, wherein the first sensing electrode faces the operating member, and the second sensing electrodes face the rotating member.

* * * * *